United States Patent [19]

Tokunaga et al.

[11] Patent Number: 5,243,283
[45] Date of Patent: Sep. 7, 1993

[54] METHOD OF NUCLEAR MAGNETIC RESONANCE ANGIOGRAPHIC IMAGING WITH REDUCED IMAGING OPERATION TIME

[75] Inventors: Yu Tokunaga, Ootawara; Hiroshi Sugimoto, Tochigiken, both of Japan

[73] Assignee: Kabushiki Kaisha Toshiba, Kanagawa, Japan

[21] Appl. No.: 718,590

[22] Filed: Jun. 21, 1991

[30] Foreign Application Priority Data

Jun. 22, 1990 [JP]  Japan .................................. 2-164643

[51] Int. Cl.$^5$ ............................................ G01R 33/20
[52] U.S. Cl. ..................................... 324/306; 324/309; 128/653.5
[58] Field of Search ............... 324/306, 307, 309, 300; 128/653.1, 653.3, 653.5

[56] References Cited

U.S. PATENT DOCUMENTS

| | | | |
|---|---|---|---|
| 4,475,084 | 10/1984 | Moore et al. | 324/309 |
| 4,549,139 | 10/1985 | MacFall et al. | 324/309 |
| 4,574,239 | 3/1986 | Singer | 324/309 |
| 4,602,641 | 7/1986 | Feinberg | 324/306 |
| 4,715,383 | 12/1987 | Ehman et al. | 324/309 |
| 4,782,839 | 11/1988 | Hennig et al. | 324/306 |
| 4,800,889 | 1/1989 | Dumoulin et al. | 324/306 |
| 4,922,202 | 5/1990 | Le Roux | 324/306 |
| 4,947,837 | 8/1990 | Sano et al. | 324/306 |
| 5,023,551 | 6/1991 | Kleinberg et al. | 324/307 |
| 5,117,187 | 5/1992 | Granot | 324/309 |

Primary Examiner—Michael J. Tokar
Assistant Examiner—Raymond Y. Mah
Attorney, Agent, or Firm—Limbach & Limbach

[57] ABSTRACT

A method of nuclear magnetic resonance angiographic imaging capable of reducing an imaging operation time. The method includes the steps of: applying a plurality of pre-saturation excitation pulses sequentially to a pre-saturation section located over the flowing stream within an imaging region of the patient formed along the flowing stream, so as to pre-saturate the flowing stream located at the pre-saturation section at a time of application of each of the pre-saturation excitation pulses; dispersing and deleting transverse components of spins due to the pre-saturation excitation pulses applied at the applying step; exciting the imaging region by applying a single imaging excitation pulse and by using appropriate gradient magnetic fields, such that nuclear magnetic resonance signals are produced from the imaging region; and collecting the nuclear magnetic resonance signals from the imaging region by using appropriate gradient magnetic fields, and obtaining a nuclear magnetic resonance image showing a plurality of pre-saturated patterns corresponding to a plurality of the pre-saturation excitation pulses by processing the nuclear magnetic resonance signals.

5 Claims, 3 Drawing Sheets

FIG.1
PRIOR ART
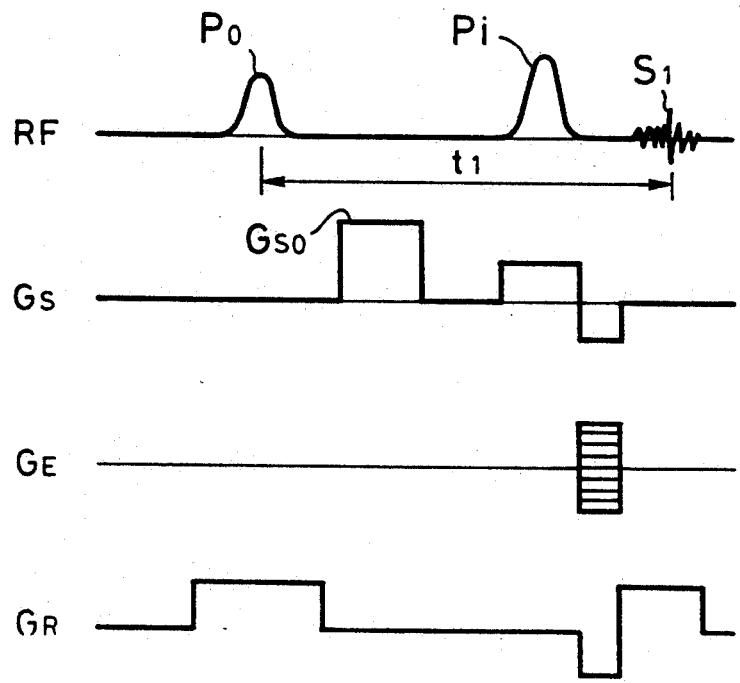
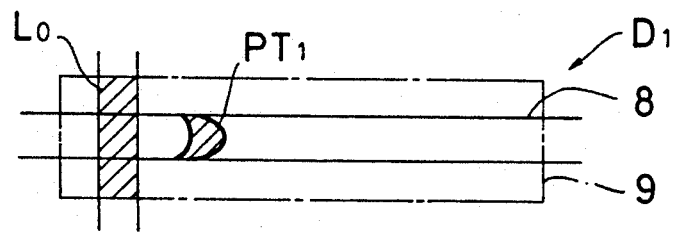
FIG.2(A)
PRIOR ART
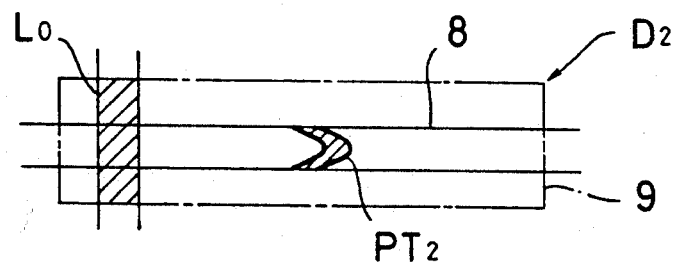
FIG.2(B)
PRIOR ART
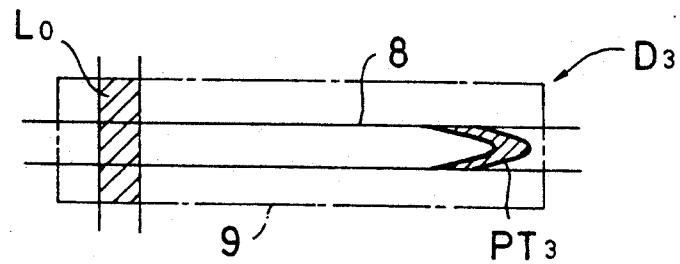
FIG.2(C)
PRIOR ART

METHOD OF NUCLEAR MAGNETIC RESONANCE ANGIOGRAPHIC IMAGING WITH REDUCED IMAGING OPERATION TIME

BACKGROUND OF THE INVENTION

1. Field of the Invention

The present invention relates to a nuclear magnetic-resonance angiographic imaging for taking an image of a flowing stream section such as a blood vessel of a patient by utilizing a nuclear magnetic resonance imaging technique.

2. Description of the Background Art

As a conventional method for imaging a flowing stream section such as a blood vessel of a patient by using a nuclear magnetic resonance, a so called bolus tracking method is known.

A typical pulse sequence used in this bolus tracking method is shown in FIG. 1, where RF indicates the RF pulses, $G_S$ indicates the slicing gradient magnetic field, $G_E$ indicates an encoding gradient magnetic field, and $G_R$ indicates a reading gradient magnetic field, while the nuclear magnetic resonance images obtained by using this pulse sequence are shown in FIGS. 2(A), 2(B), and 2(C).

In this bolus tracking method, a pre-saturation section $L_0$ within an imaging region 9 formed over a blood stream in a blood vessel 8 is excited first by a pre-saturation excitation pulse $P_0$ for pre-saturating this pre-saturation section $L_0$ such that the blood stream located at this pre-saturation section $L_0$ at that point will not produce the nuclear magnetic resonance signals subsequently. Then, a large slicing gradient magnetic field $G_{S0}$ which is larger than the usual slicing gradient magnetic field $G_S$ is applied to the imaging region 9 in order to disperse and thereby delete the transverse components of spins produced by the excitation due to the application of the pre-saturation excitation pulse $P_0$. Next, the imaging region 9 is excited again by the application of an imaging excitation pulse $P_i$. As a result, the nuclear magnetic resonance signals $S_1$ are produced at a time $t_1$ (an echo time) after the application of the pre-saturation excitation pulse $P_0$, which are collected by using the encoding gradient magnetic field $G_E$ in 64 to 256 different field strengths and the reading gradient magnetic field $G_R$.

By this procedure, it is possible to obtain an image $D_1$ shown in FIG. 2(A) which shows a pre-saturated pattern $PT_1$ due to the blood stream located at the pre-saturation section $L_0$ at a time of the application of the pre-saturation excitation pulse $P_0$ which has subsequently moved to a position of the pre-saturated pattern $PT_1$ during the time $t_1$. In FIG. 2(A), the pre-saturation section $L_0$ and the pre-saturated pattern $PT_1$ are shadowed because they appear as black areas on the resulting nuclear magnetic resonance image in contrast to the remaining area, as no nuclear magnetic resonance signal can be received from these pre-saturated sections.

Now, by using the similar procedure with the longer echo time $t_2$, an image $D_2$ shown in FIG. 2(B) showing a pre-saturated pattern $PT_2$ at a position further ahead in the blood vessel 8, and by using the similar procedure with the still longer echo time $t_3$, an image $D_3$ shown in FIG. 2(C) showing a pre-saturated pattern $PT_3$ at a position still further ahead in the blood vessel 8 can be obtained.

Then, by displaying these images $D_1$, $D_2$, and $D_3$ sequentially, it is possible to realize the cine display in which the black area of the pre-saturated portion moves from the pre-saturation section $L_0$ to the pre-saturated patterns $PT_1$, $PT_2$, and $PT_3$ sequentially, such that the actual motion of the blood stream in the blood vessel 8 can be visually represented.

However, in order to realize such a cine display by using the conventional nuclear magnetic resonance angiographic imaging, a considerably lengthy imaging operation was necessary, and the reduction of this imaging operation time has been an outstanding problem in the nuclear magnetic resonance angiographic imaging.

SUMMARY OF THE INVENTION

It is therefore an object of the present invention to provide a method of nuclear magnetic resonance angiographic imaging capable of reducing an imaging operation time.

This object is achieved in the present invention by providing a method of nuclear magnetic resonance angiographic imaging for taking a nuclear magnetic resonance image of a flowing stream in a patient placed inside a static magnetic field, comprising the sequential steps of: applying a plurality of pre-saturation excitation pulses sequentially to a pre-saturation section located over the flowing stream within an imaging region of the patient formed along the flowing stream, so as to pre-saturate the flowing stream located at the pre-saturation section at a time of application of each of the pre-saturation excitation pulses; dispersing and deleting transverse components of spins due to the pre-saturation excitation pulses applied at the applying step; exciting the imaging region by applying a single imaging excitation pulse and by using appropriate gradient magnetic fields, such that nuclear magnetic resonance signals are produced from the imaging region; and collecting the nuclear magnetic resonance signals from the imaging region by using appropriate gradient magnetic fields, and obtaining a nuclear magnetic resonance image showing a plurality of pre-saturated patterns corresponding to a plurality of the pre-saturation excitation pulses by processing the nuclear magnetic resonance signals.

Other features and advantages of the present invention will become apparent from the following description taken in conjunction with the accompanying drawings.

BRIEF DESCRIPTION OF THE DRAWINGS

FIG. 1 is a pulse sequence diagram for a conventional nuclear magnetic resonance angiographic imaging method called a bolus tracking method.

FIGS. 2(A), 2(B), and 2(C) are illustrations of the nuclear magnetic resonance images obtained by using the pulse sequence of FIG. 1.

DETAILED DESCRIPTION OF THE PREFERRED EMBODIMENTS

Now, the embodiment of a method of nuclear magnetic resonance angiographic imaging according to the present invention will be described in detail.

Figure 3:
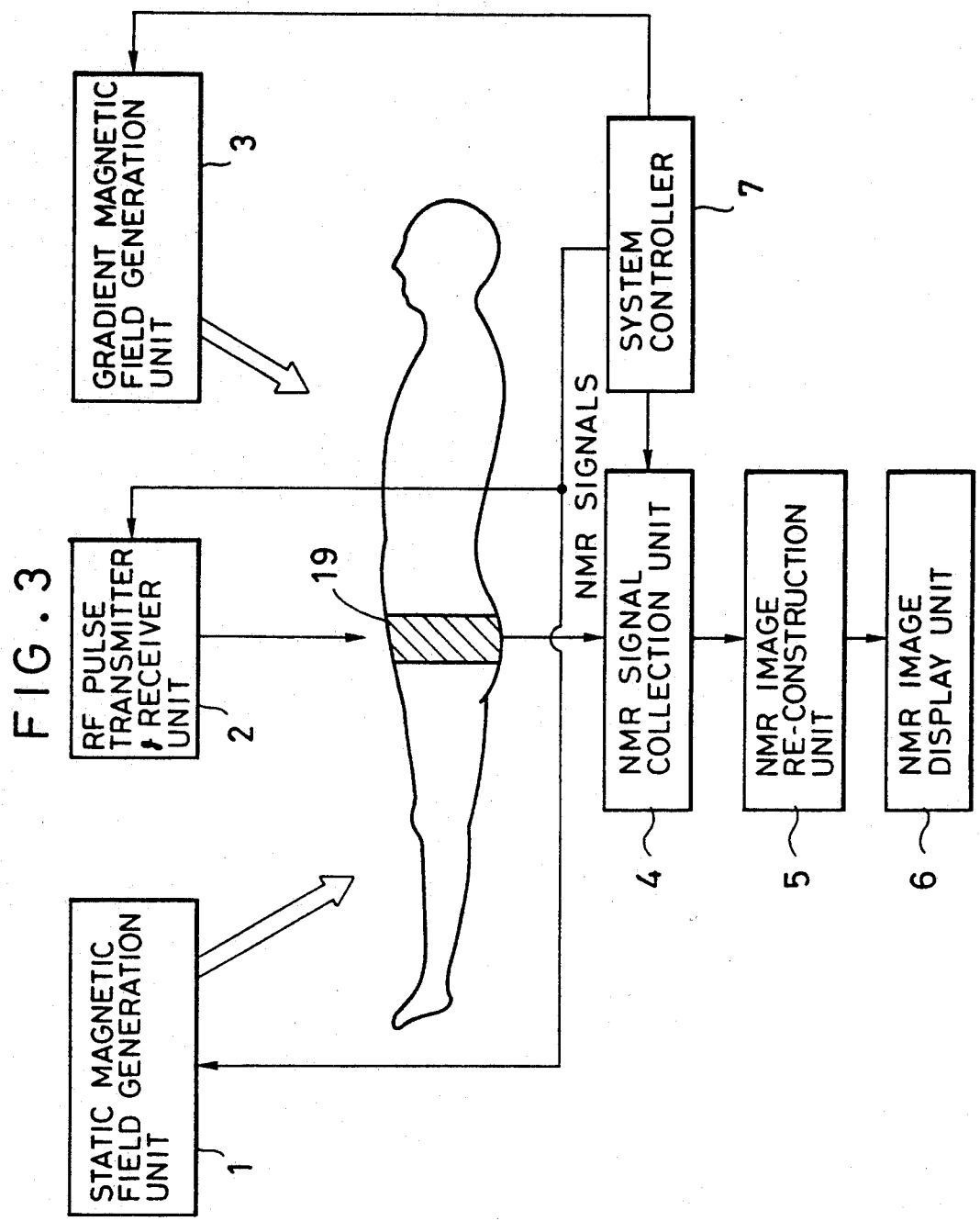
FIG. 3 is a schematic block diagram of a nuclear magnetic resonance imaging apparatus for carrying out a nuclear magnetic resonance angiographic imaging method according to the present invention.

First, with reference to FIG. 3, a nuclear magnetic resonance imaging apparatus for carrying out the method of nuclear magnetic resonance angiographic imaging according to the present invention will be described.

This nuclear magnetic resonance imaging apparatus comprises: a static magnetic field generation unit 1 for generating a static magnetic field within which a patient P is to be placed; and RF pulse transmitter and receiver unit 2 for transmitting RF pulses including pre-saturation excitation pulses and imaging excitation pulses which are to be applied to the patient P according to the pulse sequence to be described below, and receiving nuclear magnetic resonance signals due to the application of the RF pulses from a region to be imaged 19 of the patient P; a gradient magnetic field generation unit 3 for generating a slicing gradient magnetic field $G_S$, an encoding gradient magnetic field $G_E$, and a reading gradient magnetic field $G_R$, which are mutually perpendicular to each other and to be superposed onto the static magnetic field; a nuclear magnetic resonance signal collection unit 4 for collecting the nuclear magnetic resonance signals received through the RF pulse transmitter and receiver unit 2; a nuclear magnetic resonance image re-construction unit 5 for re-constructing a nuclear magnetic resonance image of the region to be imaged 19 from the nuclear magnetic resonance signals collected at the nuclear magnetic resonance signal collection unit 4 by executing the two-dimensional Fourier transform on the collected nuclear magnetic resonance signals; a nuclear magnetic resonance image display unit 6 for displaying the nuclear magnetic resonance image re-constructed at the nuclear magnetic resonance image re-construction unit 5; and a system controller 7 for controlling the operations of the above described elements of the apparatus.

In this apparatus, the static magnetic field generation unit 1, the RF pulse transmitter and receiver unit 2, the gradient magnetic field generation unit 3, and the nuclear magnetic resonance signal collection unit 4 are controlled by the system controller 7 according to the pulse sequence for the method of nuclear magnetic resonance angiographic imaging according to the present invention, which will now be described with reference to FIG. 4.

Figure 4:
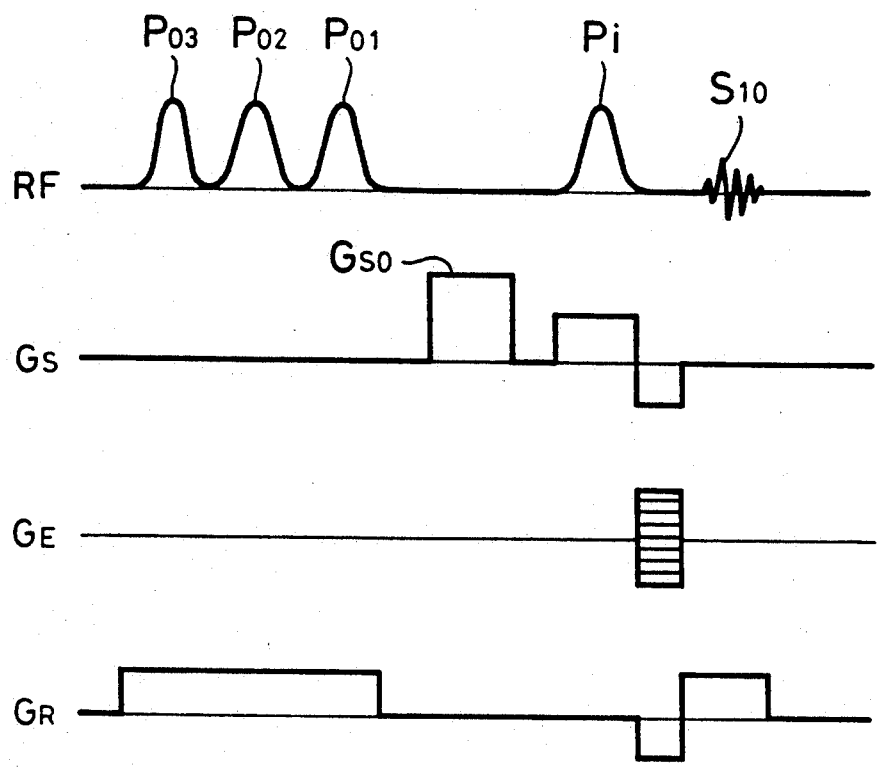
FIG. 4 is a pulse sequence diagram for a nuclear magnetic resonance angiographic imaging method according to the present invention.
Figure 5:
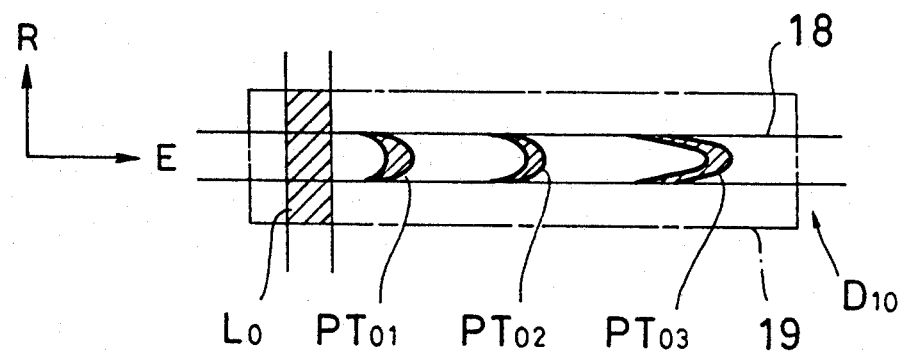
FIG. 5 is an illustration of the nuclear magnetic resonance image obtained by using the pulse sequence of FIG. 4.

FIG. 4 shows the pulse sequence for the method of nuclear magnetic resonance angiographic imaging according to the present invention in a form of a gradient field echo sequence, while the nuclear magnetic resonance image obtained by using this pulse sequence is shown in FIG. 5.

Here, the encoding gradient magnetic field $G_E$ is to be applied in a direction E along a blood stream in a blood vessel 18, while the reading gradient magnetic field $G_R$ is to be applied in a direction R which is perpendicular to the direction E as shown in FIG. 5.

First, a pre-saturation section $L_0$ within an imaging region 19 formed over a blood stream in a blood vessel 18 is excited by consecutive applications of a plurality (three in the embodiment of FIG. 4) of pre-saturation excitation pulses $P_{01}$, $P_{02}$, and $P_{03}$ for pre-saturating this pre-saturation section $L_0$ such that the blood stream located at this pre-saturation section $L_0$ at a time of application of each pre-saturation excitation pulse will not produce the nuclear magnetic resonance signals subsequently. Here, the pre-saturation excitation pulses $P_{01}$, $P_{02}$, and $P_{03}$ are applied sequentially at a predetermined interval, and are capable of producing a tilt angle of $90° + \alpha$, where $\alpha$ is a value to be determined from the longitudinal relaxation time and the echo time appropriate for the body of the patient P.

Then, a large slicing gradient magnetic field $G_{S0}$ which is larger than the usual slicing gradient magnetic field $G_S$ is applied to the imaging region 19 in order to disperse and thereby delete the transverse components of spins produced by the excitation due to the application of the pre-saturation excitation pulses $P_{01}$, $P_{02}$, and $P_{03}$.

Next, the imaging region 19 is excited again by the application of an imaging excitation pulse Pi capable of producing a tilt angle of 90° and the usual slicing gradient magnetic field $G_S$. As a result, the nuclear magnetic resonance signals $S_{10}$ are produced, which are collected by using the encoding gradient magnetic field $G_E$ in 64 to 256 different field strengths and the reading gradient magnetic field $G_R$.

By this procedure, it is possible to obtain an image $D_{10}$ shown in FIG. 5 which shows three pre-saturated patterns $PT_{01}$, $PT_{02}$, and $PT_{03}$ due to the blood stream located at the pre-saturation section $L_0$ at a time of the application of the pre-saturation excitation pulses $P_{01}$, $P_{02}$, and $P_{03}$, respectively, which have subsequently moved to positions of the pre-saturated patterns $PT_{01}$, $PT_{02}$, and $PT_{03}$ during the time between the application of the pre-saturation excitation pulses $P_{01}$, $P_{02}$, and $P_{03}$ and the production of the nuclear magnetic resonance signals $S_{10}$. In FIG. 5, the pre-saturation section $L_0$ and the pre-saturated patterns $PT_{01}$, $PT_{02}$, and $PT_{03}$ are shadowed because they appear as black areas on the resulting nuclear magnetic resonance image in contrast to the remaining area, as no nuclear magnetic resonance signal can be received from these pre-saturated sections.

This method of nuclear magnetic resonance angiographic imaging according to the present invention described above can be executed by operating the nuclear magnetic resonance imaging apparatus of FIG. 3 as follows.

First, the patient P is placed inside the static magnetic field generated by the static magnetic field generation unit 1, so as to align the nuclear spins of a specific type of nuclei along this static magnetic field.

Then, the system controller 7 controls the static magnetic field generation unit 1, the RF pulse transmitter and receiver unit 2, the gradient magnetic field generation unit 3, and the nuclear magnetic resonance signal collection unit 4 in order to execute the pulse sequence for the method of nuclear magnetic resonance angiographic imaging according to the present invention, as described above with reference to FIG. 4.

Then, the nuclear magnetic resonance image $D_{10}$ shown in FIG. 5 is re-constructed from the nuclear magnetic resonance signals $S_{10}$ received through the RF pulse transmitter and receiver unit 2 and collected by the nuclear magnetic resonance signal collection unit 4, at the nuclear magnetic resonance image re-construction unit 5, and this re-constructed nuclear magnetic resonance image $D_{10}$ showing the pre-saturated patterns $PT_{01}$, $PT_{02}$, and $PT_{03}$ together is subsequently displayed on the nuclear magnetic resonance image display unit 6 for the purpose of observation by an operator.

Thus, according to this embodiment, by using three pre-saturation excitation pulses $P_{01}$, $P_{02}$, and $P_{03}$, the imaging operation time required for obtaining the image showing three pre-saturated patterns $PT_{01}$, $PT_{02}$, and $PT_{03}$ can be reduced to approximately ⅓ compared with the conventional case using the pulse sequence of FIG. 1. In the similar manner, the imaging operation time can be reduced further for obtaining the image showing more pre-saturated patterns.

It is to be noted that the present invention is equally applicable to the pulse sequence other than the gradient field echo sequence described above such as a spin echo sequence.

Also, any one or more of the slicing gradient magnetic field $G_S$, encoding gradient magnetic field $G_E$, and reading gradient magnetic field $G_R$ may be utilized in dispersing the unnecessary transverse components of the spins.

In addition, the pre-saturation section to be pre-saturated by the pre-saturation excitation pulse may be provided at more than one locations if desired.

Besides these, many modifications and variations of the above embodiments may be made without departing from the novel and advantageous features of the present invention. Accordingly, all such modifications and variations are intended to be included within the scope of the appended claims.

We claim:

1. A method of nuclear magnetic resonance angiographic imaging for taking a nuclear magnetic resonance image of a flowing stream in a patient placed inside a static magnetic field, comprising the sequential steps of:

applying a plurality of pre-saturation excitation pulses sequentially to a pre-saturation section located over the flowing stream within an image region of the patient formed along the flowing stream;

pre-saturating a plurality of different portions of the flowing stream located at the pre-saturation section with each portion of said flowing stream pre-saturated in response to each pre-saturation excitation pulse;

dispersing and deleting transverse components of spins of each different portions of the flowing stream due to the pre-saturation excitation pulses applied at the applying step;

exciting the image region by applying a single imaging excitation pulse and gradient magnetic fields, such that nuclear magnetic resonance signals are produced from the imaging region; and collecting and processing the nuclear magnetic resonance signals from the imaging region by using gradient magnetic fields, and obtaining a nuclear magnetic resonance image showing a plurality of pre-saturated patterns each corresponding to a different one of the plurality of different portions of flowing stream.

2. The method of claim 1, wherein at the applying step the plurality of pre-saturation excitation pulses are applied sequentially at a predetermined interval.

3. The method of claim 1, wherein at the dispersing step the transverse components of spins are dispersed by using a gradient magnetic field having a field strength greater than that used in the exciting step and the collecting step.

4. The method of claim 1, wherein at the exciting step and the collecting step the appropriate gradient magnetic fields are given in a form of a gradient field echo sequence.

5. The method of claim 1, wherein at the exciting step and the collecting step the appropriate gradient magnetic fields are given in a form of a spin echo sequence.

* * * * *